United States Patent [19]

Kishi et al.

[11] Patent Number: 4,992,693
[45] Date of Patent: Feb. 12, 1991

[54] PIEZO-RESONATOR

[75] Inventors: Yoshikatsu Kishi; Mamoru Katayanagi; Haruyoshi Koyama; Hirofumi Mochitomi; Toshio Osawa; Hiroyoshi Tanaka, all of Hiki, Japan

[73] Assignee: Toko Kabushiki Kaisha, Tokyo, Japan

[21] Appl. No.: 415,705

[22] Filed: Oct. 2, 1989

[30] Foreign Application Priority Data

Oct. 4, 1988 [JP] Japan .................................. 63-130241

[51] Int. Cl.⁵ ............................................ H01L 41/08
[52] U.S. Cl. .................................... 310/348; 310/351; 310/352; 310/344
[58] Field of Search ................. 310/348, 340, 351–356, 310/344

[56] References Cited

U.S. PATENT DOCUMENTS

| | | | |
|---|---|---|---|
| 2,326,923 | 8/1943 | Bokovoy | 310/354 |
| 3,359,435 | 12/1967 | Webb | 310/354 |
| 3,566,164 | 2/1971 | Boillat | 310/352 X |
| 3,909,641 | 9/1975 | Ohshima et al. | 310/352 X |
| 3,913,195 | 10/1975 | Beaver | 310/351 X |
| 4,464,598 | 8/1984 | Besson et al. | 310/348 X |
| 4,564,744 | 1/1986 | Valentin | 310/351 X |

Primary Examiner—Mark O. Budd
Attorney, Agent, or Firm—Stevens, Davis, Miller & Mosher

[57] ABSTRACT

A piezo-resonator comprises a supporting frame having a recess for attaching a piezoelectric resonator element. This recess consists of three portions, that is, a central portion, a pair of connecting portions which are outside of the central portion and a pair of end portions which are outside of the pair of connecting portions. The width $W_2$ of the connecting portion, the width $W_1$ of the central portion and the width $W_3$ of the end portion have the relationship $W_2 > W_1 > W_3$. Two terminals intersect respective connecting portions to be embedded in the supporting frame.

3 Claims, 2 Drawing Sheets 4,992,693

PIEZO-RESONATOR

BACKGROUND OF THE INVENTION

This invention relates to the structure of a piezo-resonator such as used in a clock signal generating circuit in a variety of digital systems.

FIG. 8 is a plane view showing a strip-shaped energy-confined type piezoelectric resonator element 10. In the figure, 11 and 12 denote electrodes arranged on both faces of a piezoelectric plate 13. 14 and 15 denote dummy electrodes for facilitating attachment of the piezoelectric resonator element 10 to terminals or the like, and which need not be provided. Both ends of the electrodes 11 and 12 face each other through the piezoelectric plate 13, whereas the other ends are led to the ends of the piezoelectric plate 13, respectively.

FIG. 9 shows an example of the structure of a conventional piezo-resonator employing the strip-formed piezoelectric resonator element 10 mentioned above. A supporting board 20 is made up of a printed board or the like with conductive patterns 21 and 22 formed on an insulating board. The piezoelectric resonator element 10 is fixed on the supporting board 20 by soldering the electrodes 11 and 12 and the dummy electrodes 14 and 15 to the conductive patterns 21 and 22 of the supporting board 20, respectively, and respective terminals 30 and 40 soldered to lower portions of the conductive patterns 21 and 22.

After this procedure, the piezo-resonator is coated with an outer resin 60 such as epoxy resin under the state that a gap is provided to the periphery of a vibrating portion of the piezoelectric resonator element 10. Numeral 50 denotes solder.

However, the above mentioned structure has the following drawbacks.

(1). The many junctions due to the necessity of joining the electrodes 11 and 12 of the piezoelectric resonator element 10 and the terminals 30 and 40 to the supporting board 20 complicate the assembly process.

(2). Positioning is difficult when mounting the piezoelectric resonator element 10, the terminals 30 and 40, etc. on the supporting board 20.

(3). Since the outer resin 60 contracts when it is heated to harden, stress is applied to the piezoelectric resonator element 10 and its characteristics as a piezo-resonator deteriorate.

(4). Solder-leakage may occur when the piezoelectric resonator element 10 is soldered to the conductive patterns 21 and 22 and lead the solder to attach to the vibrating portion. This excessive solder not only causes the fluctuation of a resonance frequency by suppressing the main vibration of the piezoelectric resonator element 10 but also an increase of a resonance resistance, and the generation of unnecessary spurious radiation or the like.

SUMMARY OF THE INVENTION

It is an object of the present invention to provide a piezo-resonator having a structure without stress from the outer resin to a piezoelectric resonator element, with a fewer number of junctions and the occurrence of solder-leakage, easier positioning of the piezoelectric resonator element and better productivity.

It is the feature of the structure of the piezo-resonator having a supporting frame with a recess for attaching the piezoelectric resonator element that the recess comprises three portions with different widths, that is, a central vibrating portion, a connecting portion which is on the outside of the central vibrating portion and an end portion which is further outside of the connecting portion, the width $W_2$ of the connecting portion, the width $W_1$ of the vibrating portion and the width $W_3$ of the end portion having the relationship $W_2 > W_1 > W_3$ and two terminals being embedded in the supporting frame in such a manner that the two terminals pierce the connecting portions, respectively.

BRIEF DESCRIPTION OF THE DRAWINGS

FIG. 1 is a front view, FIG. 2 is a side-sectional view along line A—A of FIG. 1, FIGS. 3 and 4 are front views, FIG. 5 is a front view with one portion removed.

DETAILED DESCRIPTION OF THE PREFERRED EMBODIMENTS

FIGS. 1~5 refer to the embodiment of the present invention. In these figures, the same numerals are used for portions which correspond to those of the prior art already mentioned.

Figure 1:
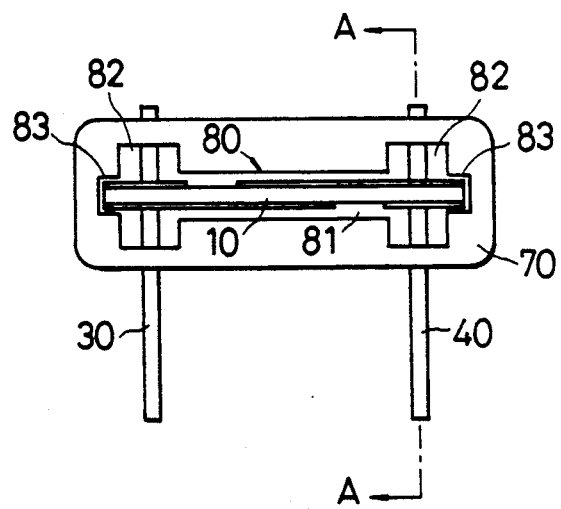
FIGS. 1~5 show the production processes of an embodiment of a piezo-resonator of the present invention.
Figure 2:
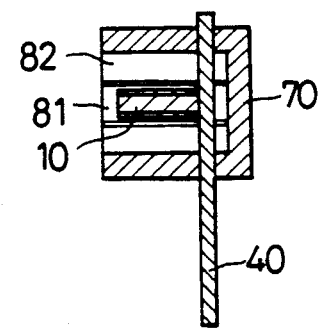
Figure 3:
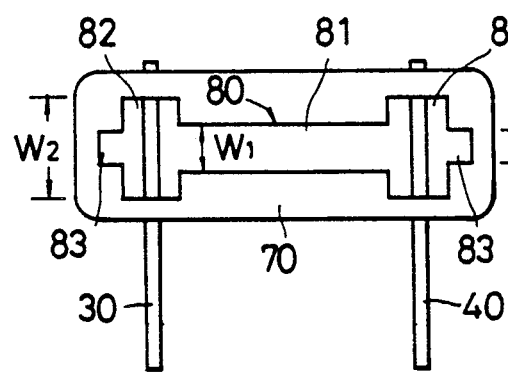
Figure 5:
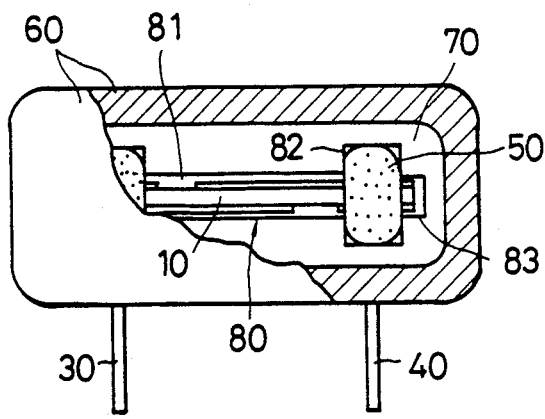

FIG. 5 shows the embodiment of the piezo-resonator of the present invention. FIGS. 1 and 3 are the front views of the piezo-resonator during assembly. FIG. 2 is the sectional view along line A—A of FIG. 1.

In FIG. 5, 70 denotes a supporting frame, which is made of an insulating material such as synthetic resin, alumina, etc., to which a recess 80 for attaching a piezoelectric resonator element 10 is arranged.

As is obvious by FIG. 3, the space in the recess 80 consists of the three portions of a central portion 81 for arranging a vibrating portion of the piezoelectric resonator element 10, a wider connecting portion 82 which is outside of the central portion 81 and an end portion 83 which is further outside of the connecting portion 82. The width $W_3$ of the end portion 83 is a little wider than the thickness of the piezoelectric resonator element 10, the width $W_1$ of the central portion 81 is formed somewhat wider than the width $W_3$ of the end portion 83 so as not to prevent the vibration of the piezoelectric resonator element 10, furthermore, the width $W_2$ of the connecting portion 82 is much wider than the width $W_1$ of the central portion 81. Accordingly, the relationship among the width $W_2$ of the connecting portion 82, the width $W_1$ of the central portion 81 and the width $W_3$ of the end portion 83 is $W_2 > W_1 > W_3$.

Two terminals 30 and 40 are embedded in the supporting frame 70 in such a manner that the two terminals pierce the connecting portions 82 which are the widest.

As is shown in FIGS. 1 and 2, the piezoelectric resonator element 10 is attached in the recess 80 in such a manner that the vibrating part of the piezoelectric resonator element 10 is located in the central portion 81.

The piezoelectric resonator element 10 is supported in about the center of the perpendicular direction of the recess 80 by the end portion 83 with a narrow width and crosses the terminals 30 and 40 in the connecting portions 82.

As is shown in FIG. 5, electrodes of the piezoelectric resonator element 10 are electrically connected and fixed to the terminals 30 and 40, respectively by a joining agent 50 such as solder in the connecting portion 82. 60 denotes outer resin with which the whole supporting frame 70 is coated.

Figure 4:
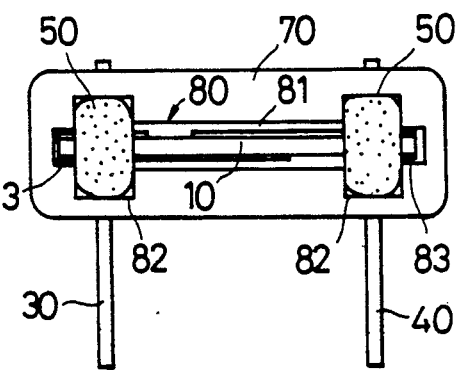

The production method of this piezo-resonator is explained hereinafter. The supporting frame 70 having the recess 80 as shown in FIG. 3 is formed and the terminals 30 and 40 are embedded in the supporting frame 70 in such a manner that the terminals 30 and 40 pierce the connecting portions 82, respectively. As is shown in FIGS. 1 and 2, the piezoelectric resonator element 10 is arranged in the recess 80. A joining agent 50 such as cream solder or conductive paste is dropped and filled in the connecting portion 82 of the recess 80 to be heated so as to electrically and mechanically join the piezoelectric resonator element 10 and the terminals 30 and 40, respectively, as shown in FIG. 4. After that, a gap-forming agent such as wax is filled in the central portion 81, the whole supporting frame 70 is dipped to be coated with the outer resin 60. Then the piezo-resonator as shown in FIG. 5 is finally formed by eliminating the gap-forming agent from the central portion 81. The elimination of the agent may be conducted by a well known method such as expelling the agent to the outside of the outer resin 60 by solvent or by heating the agent to be absorbed by the outer resin 60.

Figure 6:
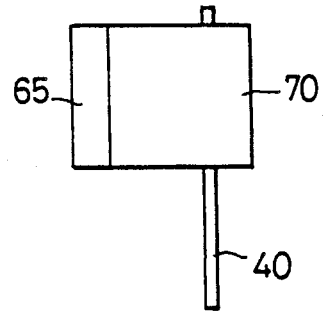
FIG. 6 is a side view of another embodiment of the present invention.

The piezo-resonator may also be formed in such a manner that the recess 80 is sealed by placing a cover 65 over the front of the supporting frame 70 as shown in FIG. 6 after the terminals 30 and 40 are connected and fixed to the piezoelectric resonator element 10 without filling the gap-forming agent.

Figure 7:
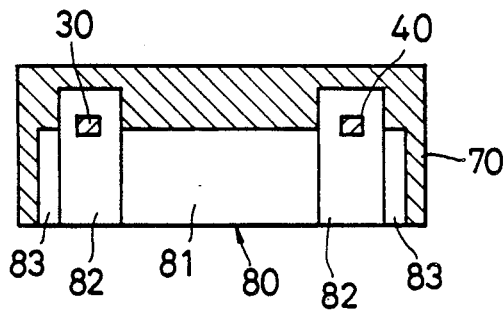
FIG. 7 is a plane-sectional view of a supporting frame of another embodiment.
Figure 8:
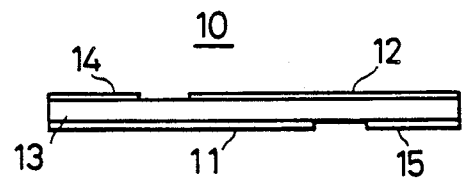
FIG. 8 is an enlarged front view of a piezoelectric resonator element.
Figure 9:
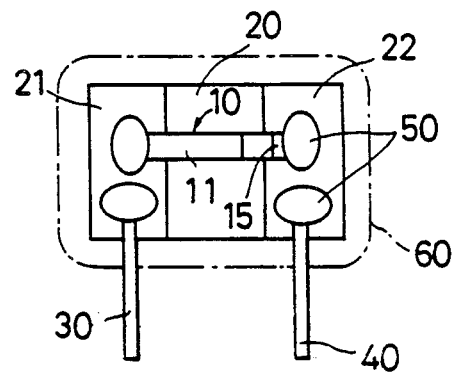
FIG. 9 is a front view of a conventional piezo-resonator.

The recess 80 may pierce the supporting frame 70. The connecting portion 82 may be formed not only as a rectangle but also as a circle. Furthermore, as shown in FIG. 7, solder-leakage is further prevented if the connecting portion 82 is deeper than the central portion 81 in the recess 80.

According to the present invention, since the connection of the terminals to the piezoelectric resonator element is conducted in the wider connecting portion, it is easy to drop the joining agent such as cream solder. The connecting portion acts as a solder pool to lessen solder or conductive paste-leakage so that the already mentioned problems such as the generation of unnecessary spurious radiation are solved. Solder, wax or the like is uniformly spread by the connecting portion or vibration portion in the recess. The contracting force of the outer resin is hardly applied to the piezoelectric resonator element enclosed by the supporting frame so that a piezo-resonator with stable characteristics is obtained. Furthermore, the position of attachment of the piezoelectric resonator element is determined by the narrow end portion in the recess of the supporting frame so that assembly is easy and the fewer number of junctions improves productivity.

What is claimed is:

1. A piezo-resonator comprising:
   a supporting frame which is made of an insulating material and on which a recess if formed;
   two terminals which intersect said recess to be embedded in said supporting frame;
   a piezoelectric resonator element which is arranged in said recess and both end portions of which are electrically connected and fixed to said respective terminals,
   wherein said recess comprises a central portion in which a vibrating portion of said piezoelectric resonator element is located, a pair of connecting portions which are arranged at respective ends of said vibrating portion and a pair of end portions which are arranged at the outside of these respective connecting portions and at which said respective end portions of said piezoelectric resonator element are located and the width $W_2$ of said connecting portion, the width $W_1$ of said vibrating portion and the width $W_3$ of said end portion have the relationship $W_2 > W_1 > W_3$.

2. A piezo-resonator according to claim 2 wherein said terminals intersect said connecting portions, respectively.

3. A piezo-resonator according to claim 2 wherein said connecting portion is formed deeper than said central portion in said recess.

* * * * *